United States Patent
Rischard et al.

(10) Patent No.: US 6,372,989 B1
(45) Date of Patent: Apr. 16, 2002

(54) EQUIPMENT CARRIER FOR ELECTRIC INSTALLATION EQUIPMENT

(75) Inventors: Karl Rischard, Obererlinsbach; Peter Hilfiker, Buchs, both of (CH); Jorg Mathiowetz, Geisenheim (DE); Emil Fuchs, Eltville-Rauenthal (DE); Markus Muller, Eltville am Rhein (DE)

(73) Assignee: Rockwell Automation AG, Aarau (CH)

( * ) Notice: Subject to any disclaimer, the term of this patent is extended or adjusted under 35 U.S.C. 154(b) by 0 days.

(21) Appl. No.: 08/331,799

(22) Filed: Oct. 31, 1994

Related U.S. Application Data

(63) Continuation of application No. 08/297,943, filed on Aug. 31, 1994, now abandoned.

(51) Int. Cl.7 .................................................. H02G 3/00
(52) U.S. Cl. ..................... 174/70 B; 361/627; 361/641; 361/648
(58) Field of Search ........................ 174/70 B; 361/600, 361/627, 641, 645, 648, 637, 626

(56) References Cited

U.S. PATENT DOCUMENTS 4,931,903 A    6/1990   Cole ........................ 361/645

FOREIGN PATENT DOCUMENTS

| DE | 2646123 | 3/1985 | |
| DE | 3811570 | 6/1989 | |
| DE | 4124487 | 7/1992 | |
| WO | 91-01583 | * 2/1991 | ................. 361/648 |

* cited by examiner

Primary Examiner—Dean A. Reichard
Assistant Examiner—W. David Walkenhorst
(74) Attorney, Agent, or Firm—Greenblum & Bernstein, P.L.C.

(57) ABSTRACT

An equipment carrier for electric installation equipment which is connectable, such as by bus bars, with a mounting support for the equipment carrier that includes an adapter lower portion that is connectable with the mounting support and an adapter upper portion, that serves for the reception of at least one installation equipment whereby the adapter lower and upper portions are formed as separate, connectable components as well as an adapter lower portion of a defined construction size being connectable with adapter upper portions of differing sizes.

19 Claims, 7 Drawing Sheets

EQUIPMENT CARRIER FOR ELECTRIC INSTALLATION EQUIPMENT

CROSS REFERENCE TO RELATED APPLICATIONS

The present application is a continuation under 35 U.S.C. § 120 of U.S. application Ser. No. 08/297,943 filed Aug. 31, 1994, now abandoned, and claims the priority of Swiss Application No. 02 592/93-1, filed Sep. 1, 1993, the disclosure of which is incorporated herein by reference in its entirety.

BACKGROUND OF THE INVENTION

1. Field of the Invention

This invention pertains to an equipment carrier for electric installation equipment wherein the equipment carrier can be coupled with a mounting support therefor.

In general practice, one-piece or unitary equipment carriers are utilized for the reception of differing electric equipment. Such equipment, may, for example, take the form of starter combinations for electric motors, line safety switches or circuit breakers and error control or volt clearing switches or the like. Such unitary equipment carriers have defined dimensions, so that, according to the space required, for a connection with specific installation equipment, equipment carriers of different dimensions must be stocked or kept in inventory. This is the case not only for the aspect of the dimensions but also in terms of the aspect of the form or shape of the equipment carrier in the region of its connection with the mounting support, which can be shaped in different types and styles, for example, in the type of the bus bar system upon which the equipment carrier can be attached or in the type of a wall or partition on which the equipment carrier can be fastened.

2. Discussion of the Background of the Invention and Material Information

For example, prior art Germany Patent Publication, DE 2646123 C2 discloses an equipment carrier for electric installation equipment wherein the connection between the electric installation equipment and the equipment carrier is achieved via an assembly rail upon which the foot or base of the installation equipment can be attached. It is a disadvantage of this known equipment carrier, that due to its one piece construction, no extensive preassembly of the electric installation equipment is possible.

SUMMARY OF THE INVENTION

It is the primary purpose or object of this invention to produce an equipment carrier of electric installation equipment that is universally usable and especially suited for modular construction which enables extensive preassembly of the electronic installation equipment with the equipment carrier.

This task or object is achieved with an equipment carrier or electric installation equipment which can be connected with a mounting support for the equipment carrier so that the mounting carrier includes an adapter lower portion that can be coupled with the mounting support and includes an adapter upper portion which serves for the reception of at least one installation equipment, whereby the adapter lower portion and the adapter upper portion are developed as separate components; can be coupled together; and an adapter lower portion of a defined size can be coupled with adapter upper portions of different sizes.

A particular feature of this invention resides in the fact that the adapter lower portion and the adapter upper portion of the equipment carrier are developed as separate construction components which only require that the adapter upper portion be shaped with regard to the requirements of the installation equipment, whereas the adapter lower portion can be shaped with regard to the requirements that are mandatory for the mounting support. Thus, it is basically feasible that, independent of the structural site or the attachment area, that are required by the installation equipment for attachment to the equipment carrier, only one defined size of the adapter lower portion is utilized, relative to which the respective adapter upper portion is tuned or mated. Herein resides an additional specific element of this invention, namely the feature that adapter upper portions of different construction sizes can be coupled or connected with one adapter lower portion of a defined construction size. If extensive area is required for the attachment of the electrical installation equipment on the adapter upper portion, an adapter upper portion with a correspondingly large dimension is utilized which is connected with an adapter lower portion of a standard size. If the electric installation equipment requires only a small area, an adapter upper portion of small dimensions is utilized, which likewise is connected with an adapter lower portion of standard size. It is useful to adjust the dimensions of the adapter lower portion in the area of its reception with the adapter upper portion to the smallest construction size of the adapter upper portion.

In view of a described shape of the equipment carrier it is suitable both for modular construction as well as for extensive preassembly of the electric installation equipment.

The installation equipment can, of course, corresponding with the area required, be connected with an adapter upper portion of a corresponding construction size, and corresponding to the shape of the mounting support, for the equipment carrier, the corresponding adapter lower portions is chosen for connection with the adapter upper portion.

The goal or object of this invention is to utilize the smallest number of different components of the equipment carrier for its different usages, with the result that, lower production cost for the plastic components, lower storage cost, etc., are achieved in that the adapter upper portions of different construction sizes are identically shaped in the connecting area with the adapter lower portion. The preferred further embodiment particularly pertains to this relation in that the adapter upper portion and the adapter lower portion, in their assembled or coupled position, can be snapped or latched together. This construction permits, in the simplest manner, a permanent connection of the adapter upper and lower portions, and, in addition also permits a subsequent disassembly.

An actual configuration of the equipment, in this connection, includes that the connection of the adapter upper and lower portions, via the plugging together of the adapter upper and lower portions as well as the subsequently following relative motion in the separation plane between the adapter upper and lower portions, whereby the adapter upper portion includes holding tabs which, during the relative motion of the parts, slide behind retaining webs in the adapter lower portion. Naturally, the possibility exists that the holding tabs could be located in the adapter lower portion and the retaining webs be located in the adapter upper portion. The latching of the adapting upper and lower portions occurs appropriately via at least one latching tongue which, in a latching position, slides or locates behind a latch web in the adapter lower portion.

A particularly simple and useful configuration, particularly for modular construction, of the equipment carrier in the attachment area relative to the installation equipment occurs when the adapter upper portion has two parallel webs, having rows of holes that extend in the longitudinal direction adjacent to the longitudinal edges of the adapter upper portion, whereby individual ones of the rows of holes serve for the reception for securing elements for the indirect or direct securing of the associated electric installation equipment at the adapter upper portion. Screws preferably serve as the securing elements via which the respective installation is either directly connected with the adapter upper portion in the area of both of the row of holes or an assembly row is connected via the retaining elements, which in turns serves for the attachment of the installation equipment.

Since it is the primary objective of the adapter upper portion to serve as a bearing or location for the installation equipment, the preferred configuration thereof is that it is plate-shaped. Due to the rather simple configuration of this component it can be produced at low cost and has but a small storage space requirement.

The invention includes two basic embodiments for use as the adapter lower portion which result in the given type of attachment of the equipment carrier to the mounting support.

Thus, it is feasible to combine a type of parting or wall with a moving support, specifically such as a wall of a case or a cabinet for the reception of installation equipment. In this case the adapter lower portion is appropriately plate-shaped and includes cutouts for suspending the adapter lower portion via retainer means connected with the wall. With reference to a different variation, the adapter lower portion is connected with a mounting support of the type of a bus bar system. In this case, the adapter lower portion is functionally boxed-shaped and includes, on the side removed from the adapter upper portion, hook projections that grip or locate behind the bus bars. The box shaped configuration of the adapter lower portion is, in this connection, therefore functional, since then, in the adapter lower portion, at least the means for the affixing of the equipment carrier are provided in the plane of the bus bar perpendicular to the longitudinal extent thereof, together with electrical contacts for the bus bars that can be connected via electrical lines with the installation equipment. Particularly, via the use of the equipment carrier in combination with the bus bar system, it is deemed necessary, at least in the area of the respective front fact of the equipment carrier, tangible at the adapter lower portion, to utilize a boundary safety plate which makes it impossible to touch the bus bars from this side.

The supply of electrical current to the respective installation equipment can be accomplished in different ways. During the use of the equipment carrier in combination with a bus bar system, the electrical current connection with the respective installation equipment is preferably accomplished via an electrical cable which, on one side, is directly electrically connected with the installation equipment, but on the other hand is electrically connected via contact springs or like with the associated bus bar, whereby the contact springs are journalled in the adapter lower portion and supported by the associated bus bar. The respective electrical cable can then exit from the side of the equipment carrier. Basically, and this is particularly so when no bus bar system is being utilized, the supply of electrical power to the respective installation equipment can be accomplished by means of the required electrical lines.

According to a special embodiment of this invention, the adapter upper portion of an equipment carrier can be connected with an additional adapter upper portion, not associated with this equipment carrier, the additional adapter upper portion serving for the reception of at least one installation equipment. It is envisioned hereby to accomplish not only a connection of an adapter upper portion with an adapter lower portion for the formation of an equipment carrier, but also to permit the connection of two, or if necessary even several adapter upper portions directly together, so that the connecting area for the installation equipment can be increased at will. In this connection it can basically be considered that the additional adapter upper portion will be connected with a different adapter lower portion, with the consequence that two adjacently arranged equipment carriers are attached together by means of the adjoining adapter upper portions of the equipment carrier. It is also feasible to arrange two equipment carriers at a distance or at a spacing from each other, and by means of an adapter upper portion, arranged between the adapter upper portions of these equipment carriers and not having an associated adapter lower portion, to form a bridge or connection between the two equipment carriers. Naturally, this bridge between the equipment carriers can also be formed of several adapter upper portions. The last mentioned variation is particularly useful when the equipment carrier is utilized together with an electrical bus bar system.

The fastening between the adapter upper portions is practically accomplished in the facing areas of the adapter upper portions by means of connecting elements. The respective connecting element, for the connection of the adjacent adapter upper portions is preferably snap or latchable by means of a clip-type connection. The adapter upper portions, in their areas of interconnection, should include sufficiently large interacting abutting areas so that, upon the affixing of the connecting elements, the adapter upper portions act as a rigid unit.

A tangible configuration of the connection in this inter-relationship includes that the respective aperture web of the adapter upper portion and the additional adapter upper portion that is to be connected therewith is provided, on the respective side facing the adapter upper portion with at least one undercut projection extending in the longitudinal direction of the aperture web, whereby the projections of the adapter upper portion that are to be connected relative to their line of separation, are arranged in a mirror-inverted position and that the connecting element associated with the two projections is provided with two webs that are insertable into the undercut regions. In this configuration there is the possibility of sliding the respective connecting element into the one adapter upper portion and to snap or latch together with the same and thereafter to slide the other adapter upper portion onto the connecting element until it snaps or latches in.

Additional features of this invention are set forth in the dependent claims, the description of the drawing figures and are illustrated in the drawings themselves, whereby it will be noted that all individual features and all combinations of individual features are deemed inventive.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF THE PREFERRED EMBODIMENTS

Figure 1:
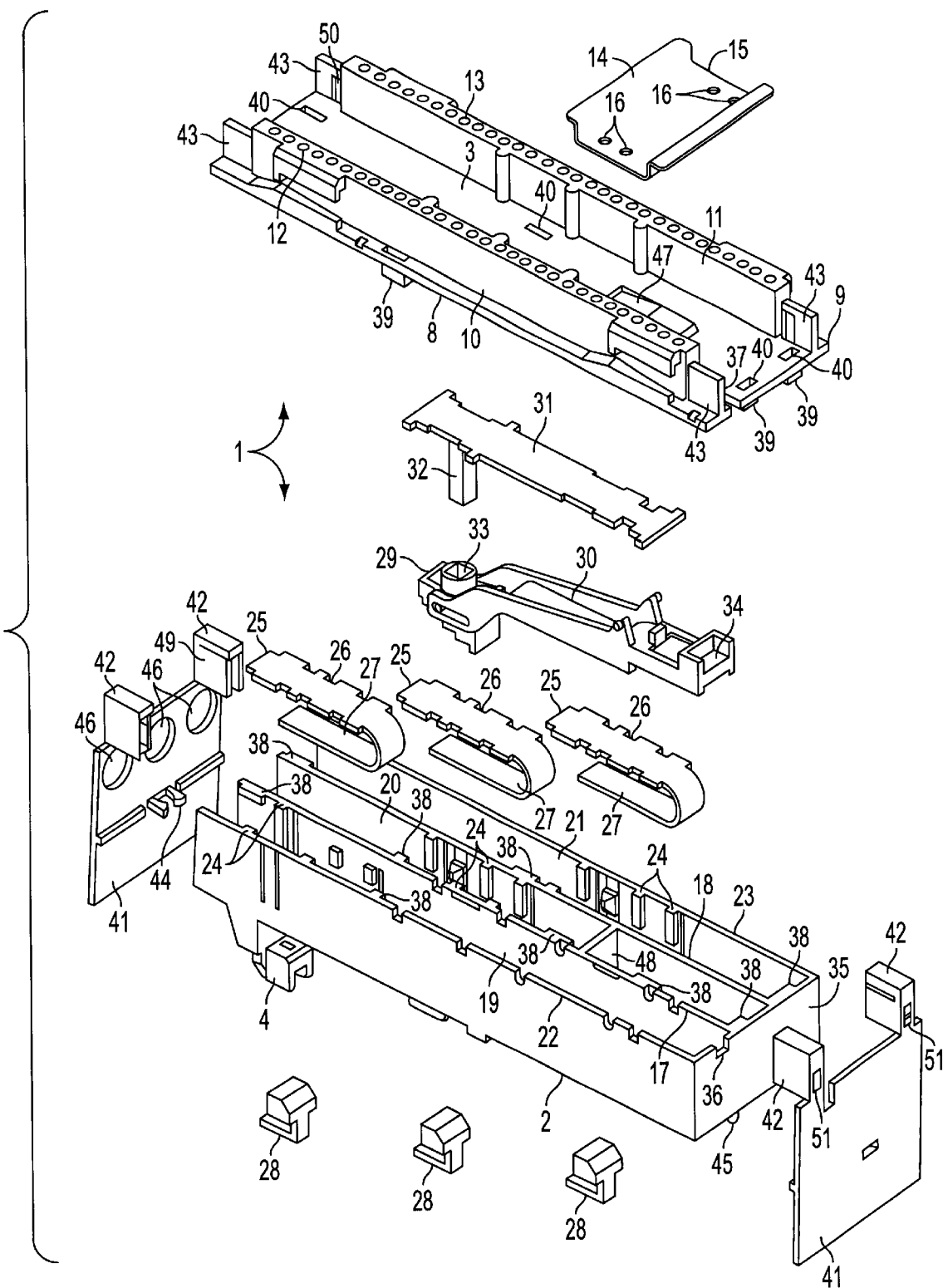
FIG. 1 is an exploded perspective view of a first embodiment of an equipment carrier that is used with a bus bar system.

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

An equipment carrier for electric installation equipment, which is utilized in connection with an electric bus bar system, will now be described with reference to FIGS. 1 and 2 and partly with reference to FIG. 3. Therein is shown that equipment carrier 1, which except for those components that need to conduct electricity, is made of plastic and is comprised of a box-shaped adapter lower portion 2 and an essentially plate-shaped adapter upper portion 3. Adapter lower portion 2 is, on its underside, provided with three contact feet 4 (only one of which is shown) that clamp or grip onto or behind three, parallel spaced bus bars 5, 6, and 7 in a well known manner. The elongated adapter lower portion 2 is thereby perpendicularly oriented to the longitudinal extension of the bus bars. Adapter upper portion 3 is connectable or connected with adapter lower portion 2, with the former having two parallel webs 10, 11, which in turn have rows of holes 12 and 13 that extend in the longitudinal direction adjacent to the longitudinal edges of adapter upper portion 3. A carrier rail 14 which is about as long as adapter upper portion 3 is wide, includes four bores 16 in its center area 15, whereby always two of the bores 16 are arranged at rows of holes 12 and 13 so that the attachment of carrier rail 14 can be accomplished by the use of four screws in the corresponding holes of the rows of holes 12 and 13 at any desired place of adapter upper portion 3. The screws themselves tap the threads in the respective holes in the rows of holes 12 and 13. Carrier rail 14 serves for the attachment of one or more electric installation equipment (not shown), for example, such as a starter combination for an electric motor, line safety switch or a fault clearing switch. Several carrier rails 14 can also be connected with adapter upper portion 3.

As is especially well shown in FIG. 1, box-shaped adapter lower portion 2 includes two separating webs 17 and 18 which subdivide a adapter lower portion 2 into three longitudinal chambers 19, 20, and 21. In each of the longitudinal chambers, by the use of cast-in guide or ribs 24 on separating webs 17, 18 as well as longitudinal walls 22 and 23, a U shaped contact spring is retained in the area of its profiled portion 26. The non-profiled other leg 27 of the respective contact spring 25 touches the equipment carrier 1, attached to bus bar 5, 6, and 7, at the associated bus bar. So that the equipment carrier 1 can be utilized for different thickness bus bars, contact feet 4 are provided with slip-on separator pedestals 28 which, with thinner bus bars, compensate the distance of the contact feet 4 which are sized for the thickest bus bar. The free end the profiled portion 26 of the respective contact spring 25 is provided with a non 10 illustrated plug connector that is connected with an electric line that leads to the electric installation equipment. These electric components are not shown per se.

As described, adapter lower portion 2 is slipped, perpendicular to the longitudinal extent of bus bar 5, 6 and 7 and in their plane, with the respective contact foot 4 or contact foot 4 with separator pedestal 28, onto the corresponding bus bars 5, 6 or 7. In order to stop adapter lower portion 2 in this direction of movement, an actuatable arresting element 29 is provided which can be brought into actuation with the middle bus bar 6. Arresting element 29 is journalled in an actuation lever 30, which, on its side is held in the region of bus bar 7 in separation web 17 and its adjacent side wall 22. Arresting element 29, on the side facing bus bar 6, is formed step wise so that it can, independent of the given width of the bus bar 6, grip same on the side facing away from the associated contact foot 4. A cover plate 31 journalled in separating web 17 and the adjacent side wall 22 covers actuating lever 30 and is provided with a guide pilot 32 in a region of its end facing arresting element 29, with guide pilot 32 extending through a recess 33 in arresting element 29 and thereby guiding same. Actuation lever 30 can be actuated via end 34 that faces away from arresting element 29. For this, the front plate 35 of adapter lower portion 2 is provided with a cutout 36 and a corresponding portion of the adapter upper portion 3 is provided with a cutout 37 through which an object can be inserted for pushing down end 34 of actuation lever 30 so that arresting element is disconnected from contact with bus bar 6. Not shown in FIG. 1 is a compression spring that acts between cover plate 31 and actuation lever 30, which surrounds guide pilot 32 and preloads arresting element 29 against bus bars 6.

The electrical installation equipment is suitably preassembled on adapter upper portion 2, i. e., carrier rail 14 is connected with adapter upper portion 3 at the desired location and thereafter the installation equipment is attached to carrier rail 14. Independent thereof the adapter lower portion is put together, that is, if necessary provided with separator pedestal 28, the required contact springs 25 are inserted into adapter lower portion 2, actuating lever 30 is assembled with a spring and arresting element 29, and adapter lower portion 2 is provided with cover plate 31. Corresponding with the current construction of the installation equipment, the free ends of contact springs 25 are connected with leads and, after the connection of adapter lower portion 2 and adapter upper portion 3, are connected to the installation equipment.

In order to connect together adapter upper and lower portions 2 and 3, adapter lower portion 2, in the region of the free end of separating webs 17 and 18, as well as side walls 22 and 23, includes a plurality of retaining webs 38 that extend in the axial direction of adapter lower portion 2, and, in corresponding portions of adapter upper portion 3 on the side facing adapter lower portion 2, there are included a plurality of holding tabs 39, of which, in FIG. 1, only three are directly in view, while the position of non-illustrated holding tabs 39, in the view of the upper surface of adapter upper portion 3, from the position of formed cavities 40, leads to the formation of holding tabs 39. The connection of adapter upper portion 3 and adapter lower portion 2 thus follows in that adapter upper portion 3 is set upon adapter lower portion 2 in an offset manner and, then, via a relative movement of adapter lower portion 2 and adapter upper portion 3 in their separation plane, holding tabs 39 are moved into the gripping position in retaining webs 38. As can be particularly well seen in FIG. 1, therein follows the movement of adapter upper portion 3 in the direction of the one front plate of adapter lower portion 2 whereby the holding tabs 39, arranged in the region of the extending small side of adapter portion 3 also grip or extend into the associated retaining web 38 of adapter lower plate 2 that face front plate 35.

In order to exclude any unintended touching of the current-carrying bus bar, in the region of each of the front walls or sides of the equipment carrier 1, a plate-shaped boundary safety plate cover 41 is provided. Each boundary safety plate 41 is affixable, in the region of its upper end, by means of two plug sockets into corresponding web projection 43 of adapter upper portion 3 and in its middle region by means of a spring or spline projection upon a lug projection 45 of adapter lower portion 2. The region of each boundary safety plate facing away from plug sockets 42 extends past and beyond adapter lower portion 2 so that in the frontal face region thereof limits the access, from the outside, to the bus bar. FIG. 1 makes clear that boundary safety plate 41 can be provided with clearances 46 through which electrical leads can be provided from contact springs 25 to the installation equipment.

The latching, snapping or arresting together of adapter lower portion 2 and adapter upper portion 3 occurs during their pushed-together or assembled position via an arrestor tongue 47 which yieldingly extends from the plane of plate-shaped adapter upper portion 3 in the direction of adapter lower portion 2 and which, in the assembled position of adapter lower portion 2 and adapter upper portion 3, locates or clamps behind arrestor webs 48, which in turn connects separator web 17 and 18.

Finally, an arrestor tongue 49 is also integrated into each one of plug sockets 42, which grip same upon the slipping of boundary safety plate 41 into a recess 50 of the corresponding web projection 43. A locking of arrestor tongue 49 can be achieved through the lifting of the associated arrestor tongue from web projection 43 via a helper tool that is asserted through a hole 51 that extends through plug socket 42 on a side facing away from adapter upper portion 3. Correspondingly, the same procedure used to move arrestor tongue 49 back into the unlocked position.

Figure 2:
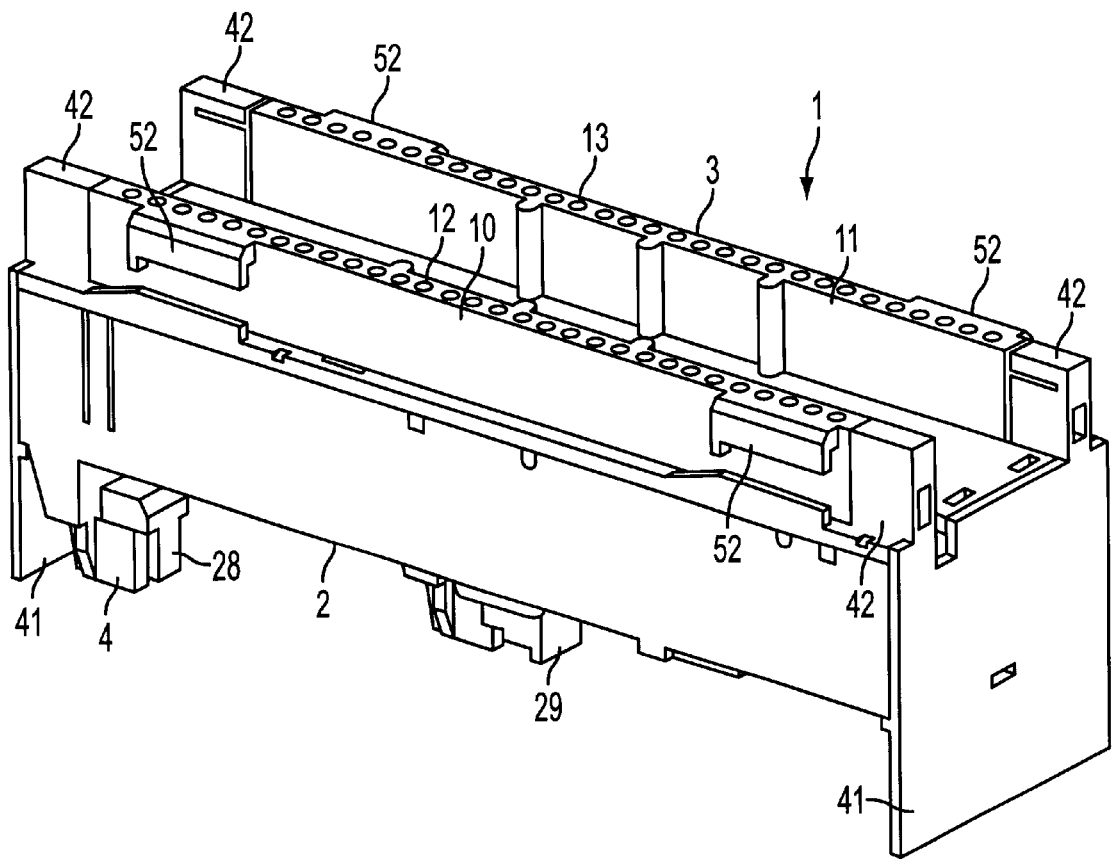
FIG. 2 is a perspective view of the equipment carrier of FIG. 1, in the assembled state, without an illustrated assembly rail.
Figure 4:
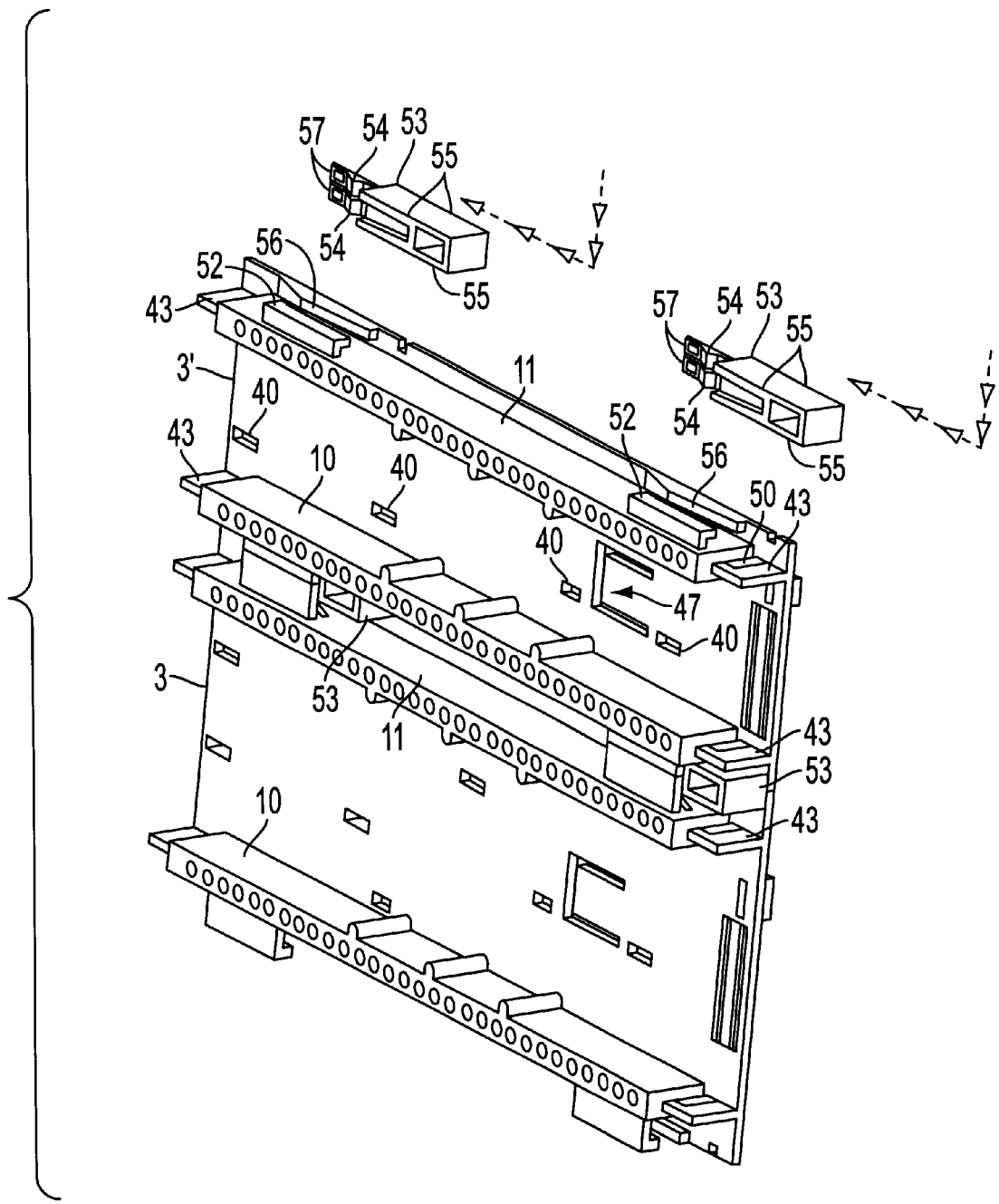
FIG. 4 is a perspective view of two interconnected adapter upper portions.

FIG. 2 shows the assembly equipment carrier including the two components that provide the boundary safety protection together with separator pedestals 28 that are slipped onto contact feet 4. FIG. 2 further shows that adapter upper portion 3 is provided with a longitudinally extending undercut L-shaped profile projection 52 in a region of each of webs 10 and 11 adjacent to the respective web projection 43 (FIG. 1). Projection 52 of respective webs 10 and 11 serve for the rigid connection of adapter upper portion 3 as is best seem in FIGS. 4 and 5. FIG. 4 shows two already interconnected adapter upper portions 3 and 3' which are connected in the region of the four facing projections 52 of both adapter upper portions 3 and 3' via two connecting elements 53.

Figure 5:
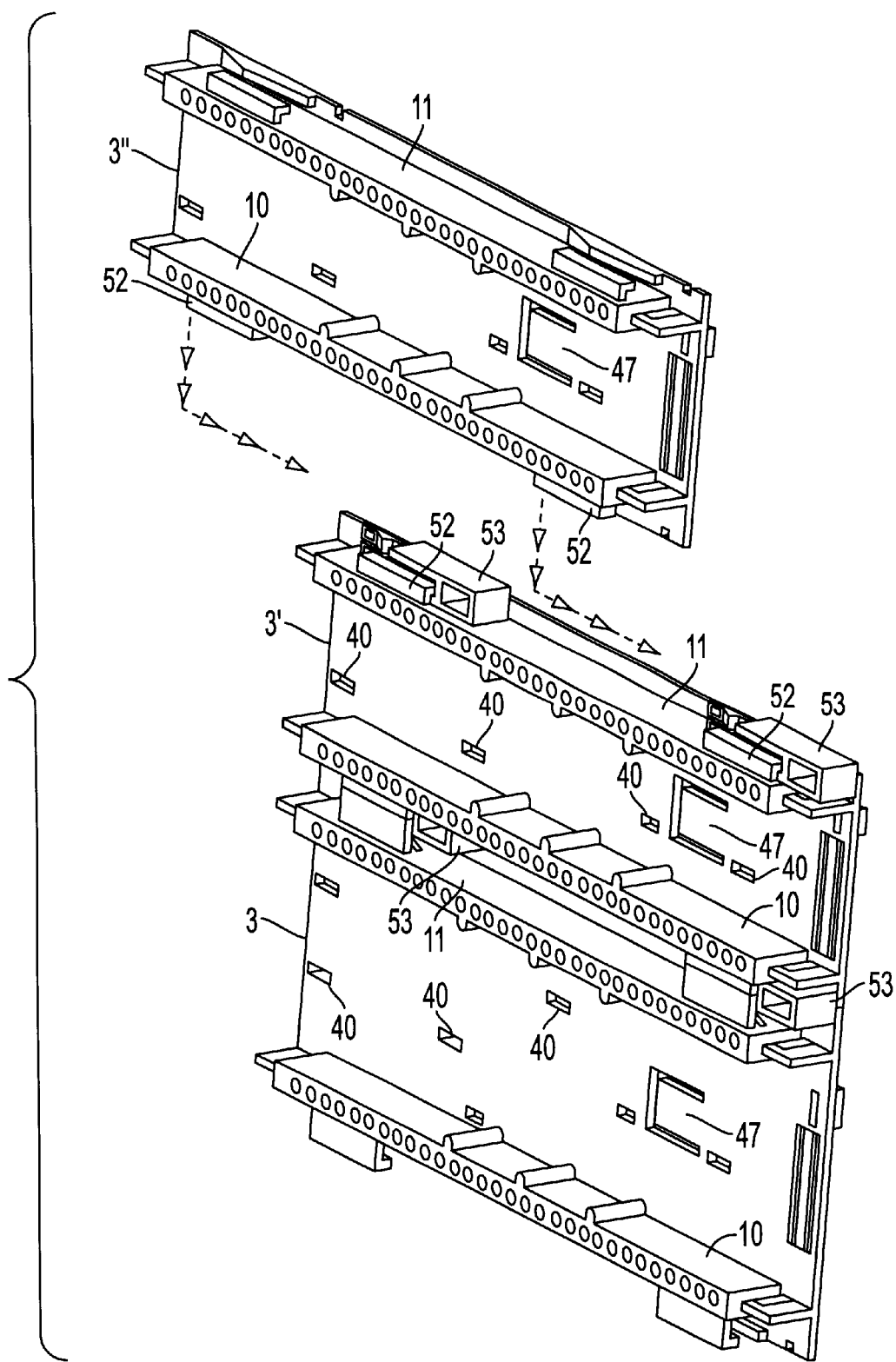
FIG. 5 is a perspective view as per FIG. 4, prior to the interconnection of the two adapter upper portions with a third adapter upper portion.

Each one of connecting elements 53 includes two parallel arranged arrestor tongues 54. The respective connecting elements 53 is connected with the facing adapter upper portion 3 and 3', in that its guide web 55, facing the respective arrestor tongue 54, is pushed between web 11 of arrestor upper portion 3 or 3' and the parallel extending guide area of L-shaped projection 52 and a plate-sided cam grove 56, projecting toward lands or webs 11 and 11', until it is fully-inserted position the arresting tab 57 of the free end of arrestor tongue 54 clamps onto the facing front wall end of projection 52. Due to the shaping of arrestor tongue 54 in the form of a spring it can again be unlocked by the pushing away of connecting element 52 via the use of a helper tool. In this described manner both connecting elements 53 are connected, in a clip-type connection with lug 11 of adapter upper portions 3 and 3'. The connection with the adjacent or boundary adapter upper portion 3' or 3", as shown in FIG. 5, is accomplished by the slipping of adapter upper portion 3' or 3" onto the arrestor tongues 54 of the two connecting elements 53 that are already connected with adapter upper portion 3 or 3'. The directions of movement for the connection of the adapter upper portion are shown in FIGS. 4 and 5 with arrows.

FIGS. 4 and 5 illustrate that, via the use of connecting element 53, any desired number of adapter upper portions can be connected together into a rigid unit, whereby the adapter upper portions, adjoined in the regions of their longitudinal plate sides with connecting elements 53, totally utilize the space between webs 11 and 12 of the adjacent adapter parts.

Figure 3:
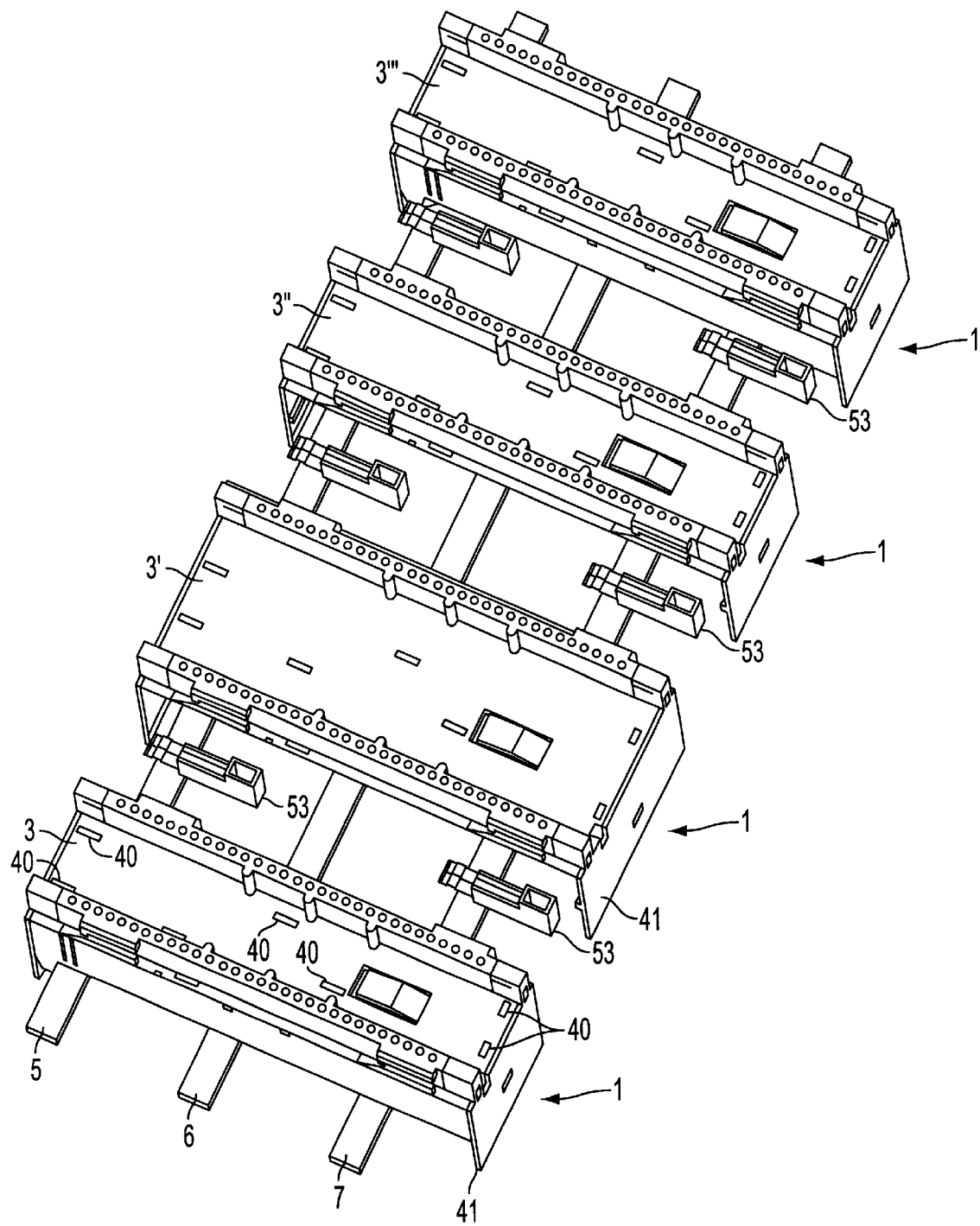
FIG. 3 is a perspective view of several of the equipment carriers of FIG. 2, prior to their interconnection, together with the bus bar system that is utilized in this connection.
Figure 6:
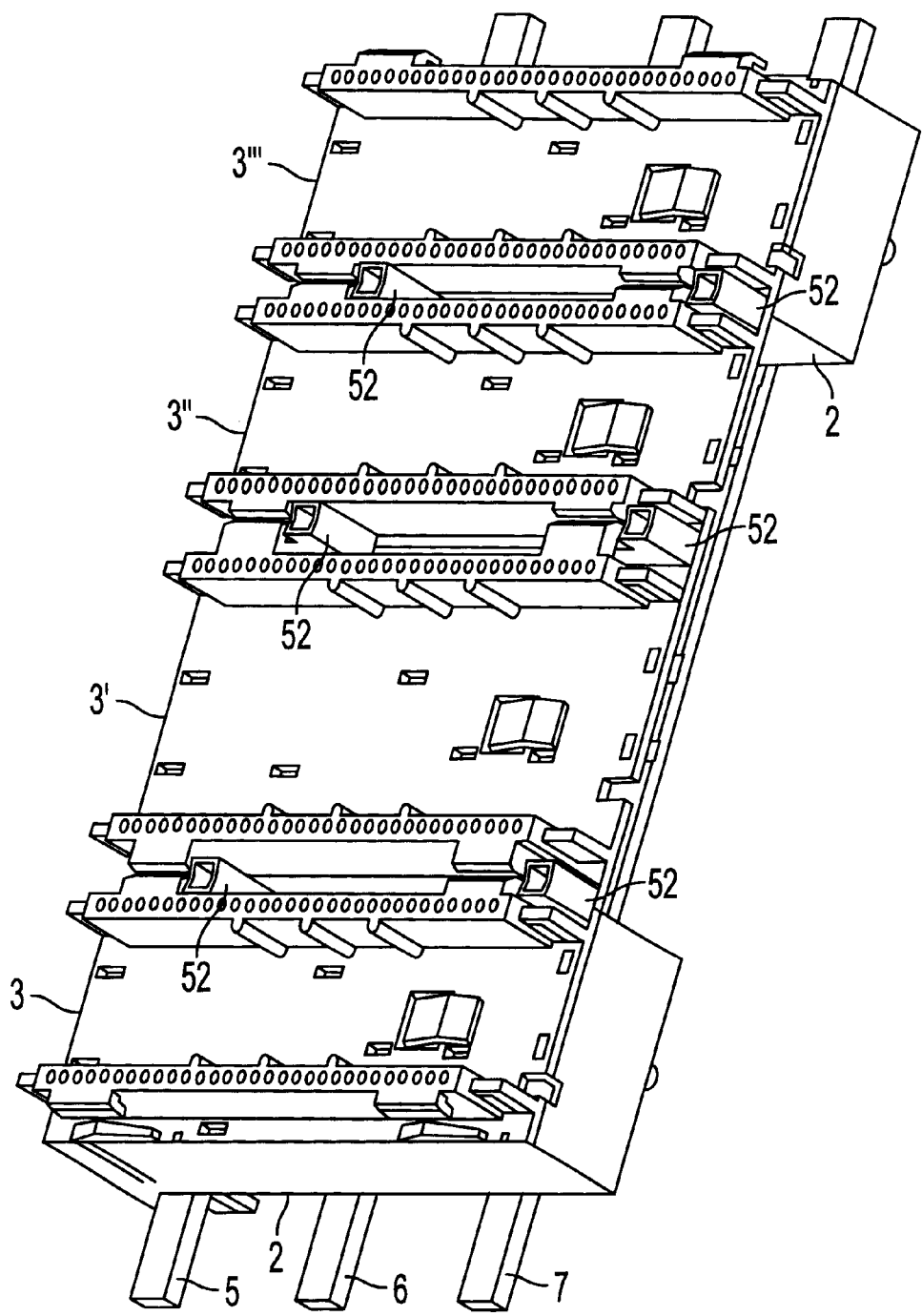
FIG. 6 is a perspective view of two equipment carriers which are interconnected in the bridging arranged by two additional adapter upper portions.

FIGS. 3 and 6 elucidate that basically there is the possibility of not associating an adapter lower portion with adapter upper portions, such as adapter upper portions 3' and 3", but only associate same with the outer adapter upper portion 3 and 3'". Thus, adapter upper portions 3' and 3" form a bridge between outer adapter portions 3 and 3'" with their associated adapter lower portions 2. The current supply, in this instances, occur solely via adapter lower portion 2 for the installation equipment arranged on adapter upper portions 3, 3', 3", and 3'".

As can readily be determined from FIG. 5, the arrangement of holding tabs 39, that is the formed cavities 40 for the holding of tabs 39, in their respective upper portions 3 and 3' are independent of the width or spacing of webs 10 and 11 of the respective adapter upper portions 3 or 3'. This means that, at all times, identical adapter lower portions 2 are used for the formation of equipment carrier 1, independent of the width of the plate of the corresponding adapter upper portion.

Figure 7:
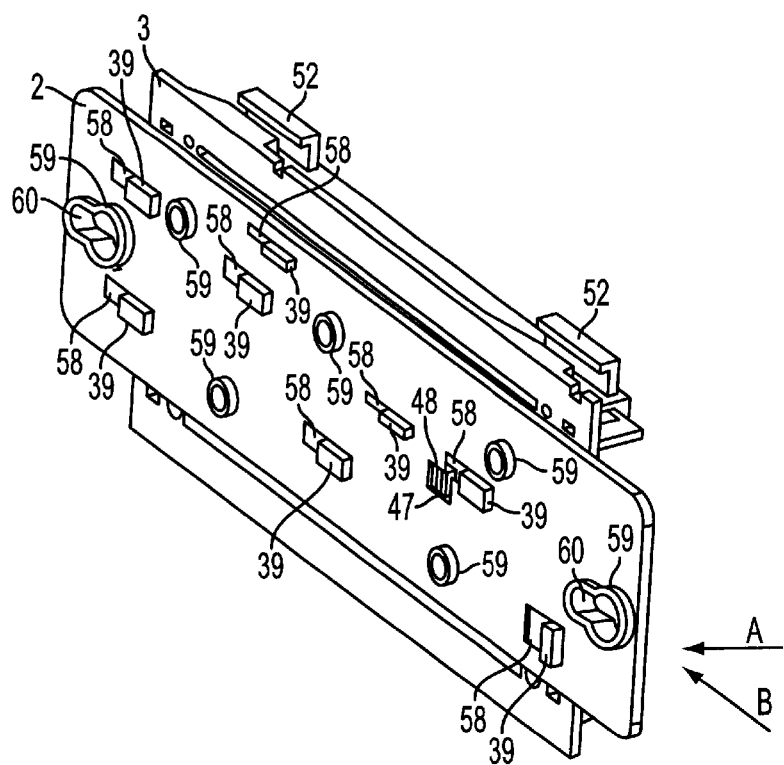
FIG. 7 is a perspective view of a second embodiment of an equipment carrier in which the adapter lower portion is plate-shaped and which serves for mounting same on a wall.
Figure 8:
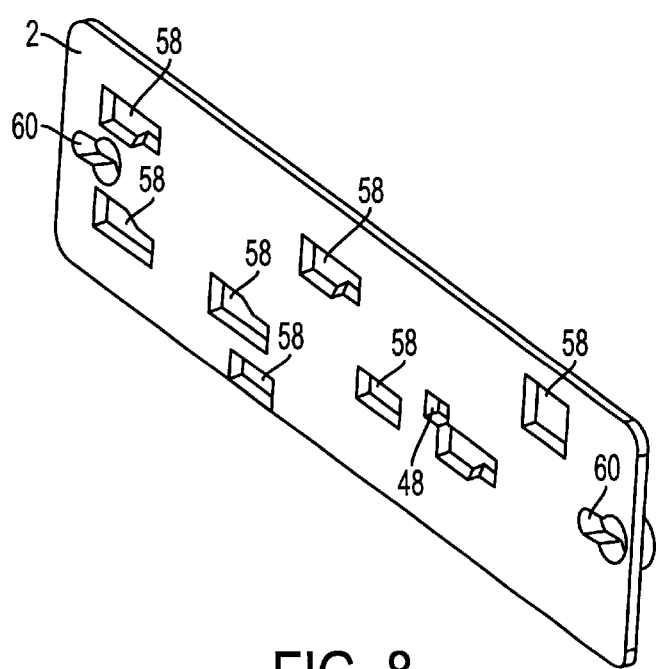
FIG. 8 is a view of the plate-shaped adapter lower portion of FIG. 7, looking in the direction of arrow A.

FIGS. 7 and 8 show a modified configuration of adapter lower portion 2 with an unchanged configuration of adapter upper portion 3. The adapter lower portion 2 serves for the attachment of a non-illustrated mounting support which is formed as a wall of a panel cabinet. Therefore, adapter lower portion 2 is shaped as a flat plate which in the slip-on direction B (arrow in FIG. 7) of adapter lower portion 2, toward adapter upper portion 3, is provided with clearances or cutouts 58 which retain the function of previously described retaining webs 38 and which work together with holding tabs 39 of adapter upper portion 3. Since holding tabs 39 extend beyond the plane of plate-like adapter lower portion 2, the latter is provided with spacer ring 59 on this side, whose thickness corresponds at least with that of holding tabs 39.

Two of spacer ring 59 include a hole 60 extending in slip-on direction B. Adapter lower portion 2 can be attached to the mounting supporting in that two attachment screws can be inserted through key-shaped elongated hole 60 and positioned in the end of key-hole 60 removed from the circular portion thereof. FIG. 8 shows a view of the surface of adapter lower portion 2 that faces adapter upper portion 3. In the embodiment of FIGS. 7 and 8, several adapter upper portions, as already described with reference to the embodiment of FIG. 6, can be interconnected. Adapter lower portion 2 need be utilized only in the regions of the two outer adapter upper portions.

While there are shown and described present preferred embodiments of the invention, it is to be distinctly understood that the invention is not limited thereto, but may be otherwise variously embodied and practiced within the scope of the following claims and the reasonably equivalent structures thereto. Further, the invention illustratively disclosed herein may be practiced in the absence of any element which is not specifically disclosed herein.

What is claimed is:

1. An equipment carrier for electric installation equipment, the equipment carrier comprising:

an adapter lower portion adapted to be interlockably and conductively coupled with at least two bus bars, and an adapter upper portion adapted to be coupled to at least one installation equipment, wherein the adapter lower portion and the adapter upper portion are formed as separate components adapted to be coupled together and are adapted to be interlockably coupled together, with the adapter lower portion of a defined construction size also being adapted to be coupled with adapter upper portions of differing sizes; and wherein the adapter upper portion of the equipment carrier is adapted to be connected with an additional adapter upper portion, not associated with the equipment carrier, with the additional adapter upper portion adapted to be coupled to at least one further installation equipment.

2. The equipment carrier of claim 1, wherein adapter upper portions of differing sizes are identically formed in a region that is adapted to be coupled with the adapter lower portion.

3. The equipment carrier of claim 1, wherein a connection of the adapter upper portion and the adapter lower portion occurs during the coupling together of the adapter upper portion and the adapter lower portion as well as the subsequent relative movement in a separation plane between the adapter upper portion and the adapter lower portion, with the adapter upper portion having holding tabs, and the adapter lower portion having retaining webs, with the holding tabs locating behind the retaining webs during relative movement between the adapter upper and lower portions.

4. The equipment carrier of claim 3, wherein the adapter upper portion includes at least one locking tongue and the adapter lower portion includes a locking web, with an interlocking of the adapter upper portion and the adapter lower portion occurring as a result of at least one locking tongue locating, in the interlocking position, behind the locking web.

5. The equipment carrier of claim 1, wherein the adapter upper portion includes at least one locking tongue and the adapter lower portion includes a locking web, with an interlocking of the adapter upper portion and the adapter lower portion occurring as a result of at least one locking tongue locating, in the interlocking position, behind the locking web.

6. The equipment carrier of claim 5, wherein the adapter upper portion is plate-shaped.

7. The equipment carrier of claim 1, wherein the adapter lower portion is plate-shaped and includes clearances for suspending the adapter lower portion with means for retention connected with the partition.

8. The equipment carrier of claim 1, wherein the adapter lower portion is box-shaped and includes hook projections on the side facing away from the adapter upper portion, the hook projections being adapted for gripping the at least two bus bars.

9. The equipment carrier of claim 8, wherein means for affixing the equipment carrier are provided in the box-shaped adapter lower portion in the plane of the at least two bus bars perpendicular to the longitudinal extent thereof, together with electrical contacts, for the at least two bus bars, with the at least two bus bars adapted to be connected via electrical lines with each installation equipment.

10. The equipment carrier of claim 9, wherein the box-shaped adapter lower portion includes two ends that extend beyond the at least two bus bars, the adapter lower portion being provided, in the area of each of the two ends that extend beyond the at least two bus bars, with a plate-shaped boundary safety cover, the cover being interlockingly connectable with the adapter lower portion and the adapter upper portion.

11. The equipment carrier of claim 8, wherein the box-shaped adapter lower portion includes two ends that extend beyond the at least two bus bars, the adapter lower portion being provided, in the area of each of the two ends that extend beyond the at least two bus bars, with a plate-shaped boundary safety cover, the cover being interlockingly connectable with the adapter lower portion and the adapter upper portion.

12. The equipment carrier of claim 11, wherein the respective boundary safety cover includes projections, with the projections, after the connection of adapter upper portion and adapter lower portion gripping the adapter lower portion on a side facing the at least two bus bars and gripping the adapter upper portion on a side facing away from the at least two bus bars, with clip connections being utilized for interlocking the boundary safety cover with the adapter upper portion and the adapter lower portion.

13. The equipment carrier of claim 1, in combination with an additional adapter upper portion, wherein the additional adapter upper portion is connected with a different adapter lower portion.

14. The equipment carrier of claim 13, wherein the adapter upper portion and the additional adapter upper portion, in their facing regions, are adapted to be connected with each other by means of connecting elements.

15. The equipment carrier of claim 1, wherein the adapter upper portions of two adjacent, spaced equipment carriers are connected together by means of at least one additional adapter upper portion, with the additional adapter upper portion extending over the spacing of the adapter upper portions associated with the two equipment carriers.

16. The equipment carrier of claim 15, wherein the adapter upper portion and the additional adapter upper portion, in their facing regions, are adapted to be connected with each other by means of connecting elements.

17. The equipment carrier of claim 16, wherein a respective web on the adapter upper portion and the additional adapter upper portion is provided, on the respective side facing each other with at least one undercut projection extending in a longitudinal direction of web, whereby the projections of the adapter upper portions adapted to be connected, relative to a common separation line, are arranged in a mirror-inverted position, with the connecting element associated with the two projections being provided with two webs, with the two webs being insertable into the undercut projections.

18. The equipment carrier of claim 1, in combination with an additional adapter upper portion, wherein the adapter upper portion and the additional adapter upper portion, in their facing regions, are adapted to be connected with each other by means of connecting elements.

19. The equipment carrier of claim 18, wherein the respective connecting element for connecting the adapter upper portion and the additional adapter upper portion are interlockable with a clip connection.

* * * * *